United States Patent
O'Meara et al.

(10) Patent No.: US 10,580,650 B2
(45) Date of Patent: Mar. 3, 2020

(54) METHOD FOR BOTTOM-UP FORMATION OF A FILM IN A RECESSED FEATURE

(71) Applicant: Tokyo Electron Limited, Minato-ku, Tokyo (JP)

(72) Inventors: David L. O'Meara, Albany, NY (US); Kandabara N. Tapily, Mechanicville, NY (US); Nihar Mohanty, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/484,688

(22) Filed: Apr. 11, 2017

(65) Prior Publication Data

US 2017/0294312 A1    Oct. 12, 2017

Related U.S. Application Data

(60) Provisional application No. 62/321,481, filed on Apr. 12, 2016.

(51) Int. Cl.
| | | |
|---|---|---|
| *H01L 21/033* | (2006.01) | |
| *H01L 21/02* | (2006.01) | |
| *H01L 21/311* | (2006.01) | |

(52) U.S. Cl.
CPC ...... *H01L 21/0338* (2013.01); *H01L 21/0228* (2013.01); *H01L 21/02172* (2013.01);
(Continued)

(58) Field of Classification Search
CPC ........... H01L 21/02172; H01L 21/0228; H01L 21/0332; H01L 21/0335; H01L 21/0337;
(Continued)

(56) References Cited

U.S. PATENT DOCUMENTS 6,900,125 B2 * 5/2005 Shimizu ............ H01L 21/76808
257/E21.579
7,262,127 B2 * 8/2007 Ishikawa ........... H01L 21/76808
257/758
(Continued)

FOREIGN PATENT DOCUMENTS

| JP | 2004273742 A | 9/2004 |
|---|---|---|
| JP | 2011255436 A | 12/2011 |

(Continued)

OTHER PUBLICATIONS

Korean Intellectual Property Office, Office Action for korean patent application No. 10-2017-0047429, dated Jul. 7, 2018, 13 pages.
(Continued)

*Primary Examiner* — Lan Vinh (57) ABSTRACT

Embodiments of the invention provide a substrate processing method for bottom-up formation of a film in a recessed feature. According to one embodiment, the method includes providing a substrate containing a first layer and a second layer on the first layer, the second layer having a recessed feature extending through the second layer, and depositing a non-conformal mask layer on the substrate, where the mask layer has an overhang at an opening of the recessed feature. The method further includes removing the mask layer from a bottom of the recessed feature, while maintaining at least a portion of the overhang at the opening, selectively depositing a film on the bottom of the recessed feature, and removing the mask layer overhang from the substrate. The processing steps may be repeated at least once until the film has a desired thickness in the recessed feature.

20 Claims, 10 Drawing Sheets

(52) U.S. Cl.
CPC .... *H01L 21/02175* (2013.01); *H01L 21/0332* (2013.01); *H01L 21/0335* (2013.01); *H01L 21/0337* (2013.01); *H01L 21/31116* (2013.01)

(58) Field of Classification Search
CPC .......... H01L 21/31116; H01L 23/5283; H01L 21/0338; H01L 21/02175
USPC ....... 438/695, 706, 710, 714, 720, 754, 763, 438/712, 719
See application file for complete search history.

(56) References Cited

U.S. PATENT DOCUMENTS

| | | | |
|---|---|---|---|
| 7,482,247 B1 | 1/2009 | Papasouliotis et al. | |
| 8,409,942 B2* | 4/2013 | Scheiper | H01L 21/28105 257/E21.409 |
| 9,305,938 B2* | 4/2016 | Simsek-Ege | H01L 27/1157 |
| 9,449,921 B1* | 9/2016 | Basker | H01L 23/485 |
| 2004/0084746 A1* | 5/2004 | Kim | H01L 21/28114 257/503 |
| 2004/0127014 A1* | 7/2004 | Huang | H01L 21/76843 438/627 |
| 2004/0185665 A1 | 9/2004 | Kishimoto et al. | |
| 2005/0016948 A1* | 1/2005 | Yang | H01L 21/76232 216/13 |
| 2007/0238279 A1* | 10/2007 | Cerio, Jr. | C23C 14/046 438/597 |
| 2009/0291542 A1* | 11/2009 | Song | H01L 21/76804 438/381 |
| 2011/0065273 A1* | 3/2011 | Yoon | C23C 16/029 438/643 |
| 2012/0103518 A1 | 5/2012 | Kakimoto et al. | |
| 2012/0149202 A1* | 6/2012 | Pyo | H01L 21/0337 438/696 |
| 2013/0187279 A1* | 7/2013 | Surthi | H01L 27/1052 257/773 |
| 2014/0144876 A1* | 5/2014 | Nakagawa | H01L 21/31116 216/51 |
| 2015/0187643 A1 | 7/2015 | Kakimoto et al. | |

FOREIGN PATENT DOCUMENTS

| | | |
|---|---|---|
| JP | 2012109537 A | 6/2012 |
| JP | 2015126161 A | 7/2015 |

OTHER PUBLICATIONS

Japan Patent Office, Official Action for Japanese patent application No. 2017-079207, dated Jul. 3, 2018, 12 pages.
Japan Patent Office, Official Action for Japanese patent application No. 2017-079207, dated Sep. 25, 2018, 8 pages.

* cited by examiner

METHOD FOR BOTTOM-UP FORMATION OF A FILM IN A RECESSED FEATURE

CROSS-REFERENCE TO RELATED APPLICATIONS

This application is related to and claims priority to U.S. Provisional Patent Application Ser. No. 62/321,481 filed on Apr. 12, 2016, the entire contents of which are herein incorporated by reference.

FIELD OF INVENTION

The present invention relates to the field of semiconductor manufacturing and semiconductor devices, and more particularly, to a method for bottom-up formation of a film in a recessed feature.

BACKGROUND OF THE INVENTION

As smaller transistors are manufactured, the critical dimension (CD) or resolution of patterned features is becoming more challenging to produce. Self-aligned patterning needs to replace overlay-driven patterning so that cost-effective scaling can continue even after extreme ultraviolet lithography (EUV) introduction. Patterning options that enable reduced variability, extend scaling and enhanced CD and process control are needed. Selective formation of thin films is a key step in patterning in highly scaled technology nodes.

SUMMARY OF THE INVENTION

According to one embodiment, a substrate processed method is disclosed. The method includes a) providing a substrate containing a first layer and a second layer on the first layer, the second layer having a recessed feature extending through the second layer, and b) depositing a non-conformal mask layer on the substrate, where the mask layer has an overhang at an opening of the recessed feature. The method further includes c) removing the mask layer from a bottom of the recessed feature, while maintaining at least a portion of the overhang at the opening, d) selectively depositing a film on the bottom of the recessed feature, and e) removing the mask layer overhang from the substrate. In one example, the method further includes repeating steps b)-e) at least once until the film has a desired thickness in the recessed feature. In one example, the recessed feature may be at least substantially filled with the film.

According to another embodiment, the substrate processing method includes a) providing a substrate containing a first layer and a second layer on the first layer, the second layer having a recessed feature extending through the first layer, b) conformally depositing a film on a sidewall and a bottom of the recessed feature, and c) selectively removing the film from the sidewall form the film on the bottom. In one example, the method further includes repeating steps b) and c) at least once until the film has a desired thickness in the recessed feature. In one example, the recessed feature may be at least substantially filled with the film.

According to another embodiment, the substrate processing method includes a) providing a substrate containing a first layer and a second layer on the first layer, the second layer having a recessed feature extending through the first layer, b) filling the recessed feature with a film, and c) selectively removing the film from a sidewall to form the film on a bottom of the recessed feature. In one example, the method further includes repeating steps b) and c) at least once until the film has a desired thickness in the recessed feature. In one example, the recessed feature may be at least substantially filled with the film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Embodiments of the invention provide a method for bottom-up deposition of a film in a recessed feature.

Figure 1:
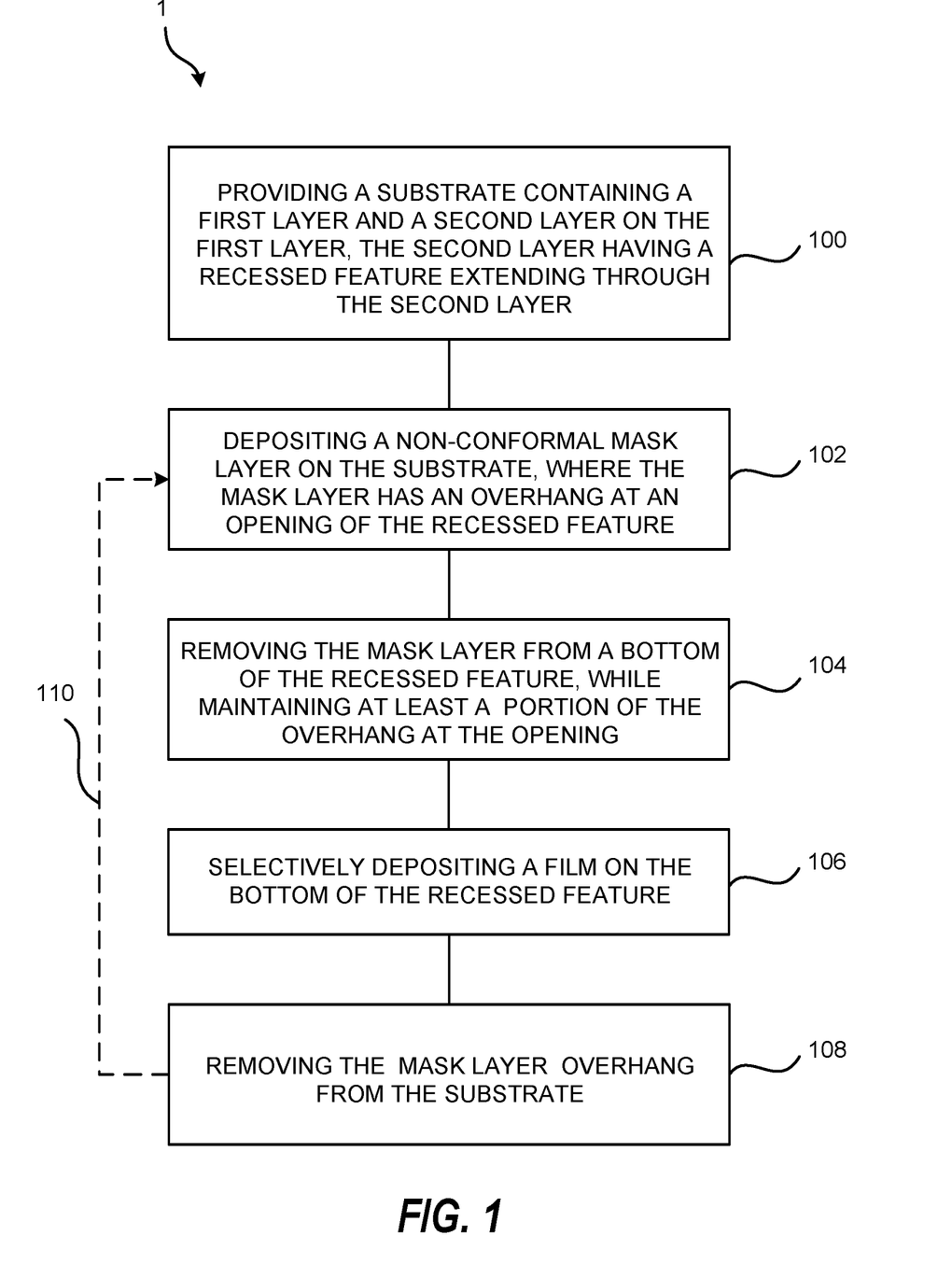
FIG. 1 is a process flow diagram for processing a substrate according to an embodiment of the invention.

FIG. 1 is a process flow diagram for processing a substrate according to an embodiment of the invention, and FIGS. 2A-2F schematically show through cross-sectional views a method of processing a substrate according to an embodiment of the invention. The process flow 1 includes, in 100, providing a substrate 200 containing a first layer 220 and a second layer 202 on the first layer 220. The second layer 202 has a field area 211 and a recessed feature 204 extending through the second layer 202. The recessed feature 204 has an opening 206, a bottom 203, and a sidewall 201. The recessed feature 204 can, for example, have a width 207 that is less than 200 nm, less than 100 nm, less than 50 nm, less than 25 nm, less than 20 nm, or less than 10 nm. In other examples, the recessed feature 204 can have a width 207 that is between 5 nm and 10 nm, between 10 nm and 20 nm, between 20 nm and 50 nm, between 50 nm and 100 nm, between 100 nm and 200 nm, between 10 nm and 50 nm, or between 10 nm and 100 nm. The width 207 can also be referred to as a critical dimension (CD). The recessed feature 204 can, for example, have a depth of 25 nm, 50 nm, 100 nm, 200 nm, or greater than 200 nm. The recessed feature 204 may also be formed using well-known lithography and etching processes.

According to one embodiment, the first layer 220 and the second layer 202 may contain the same material. Therefore, the bottom 203 and the sidewall 201 may contain the same material. Although not shown in FIG. 2A, in one example, the substrate 200 may contain a single material and the recessed feature 204 may be etched in the single material. According to another embodiment, the first layer 220 and the second layer 202 may contain different materials. For example, the bottom 203 and the sidewall 201 may be selected from the group consisting of silicon, germanium, silicon germanium, a dielectric material, a metal, and a metal-containing material. The dielectric material may selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. For example, the metal and the metal-containing materials may be selected from the group consisting of Cu, Al, Ta, Ru, TaN, TaC, and TaCN.

Figure 2A:
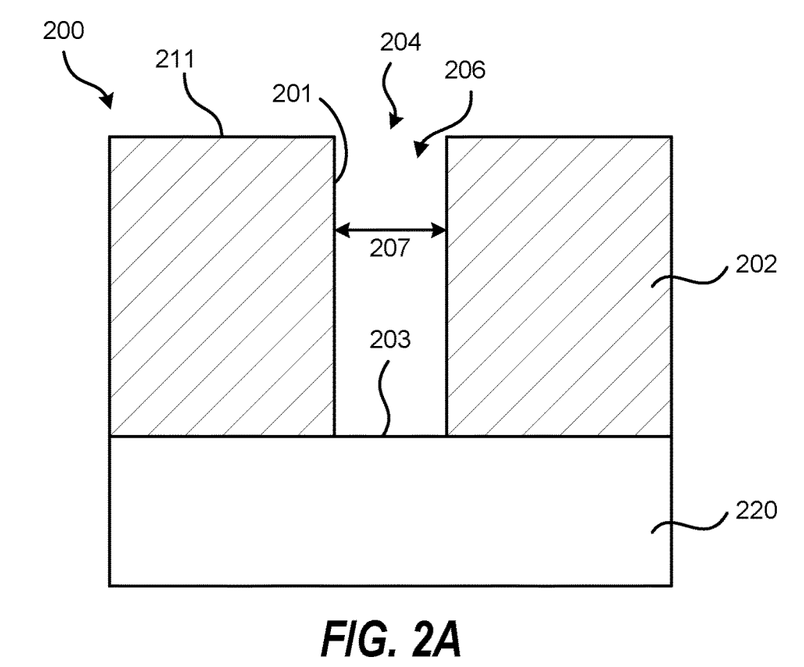
FIGS. 2A-2F schematically show through cross-sectional views a method of processing a substrate according to an embodiment of the invention.
Figure 2B:
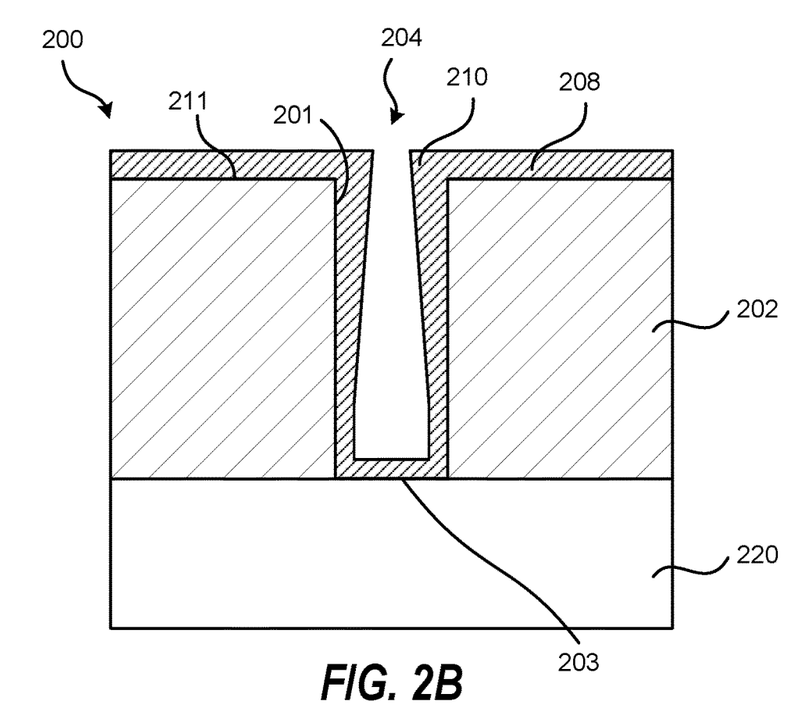

The process flow 1 further includes, in 102, depositing a non-conformal mask layer 208 on the substrate 200, where the mask layer 208 has a non-uniform thickness and has an overhang 210 at the opening 206 of the recessed feature 204. This is schematically shown in FIG. 2B. The mask layer 208 can, for example, contain a photoresist, a hard mask, $SiO_2$, SiN, or a spin-on polymer, including, but not limited to, the class of materials known as Self Assembled Monolayers (SAM). According to some embodiments, the mask layer 208 may be deposited by physical vapor deposition (PVD) or sputtering. The non-conformal deposition characteristics of forming the non-conformal mask layer 208 may be enhanced by surface treatments that reduce the surface mobility of the deposition precursor. Further, deposition conditions such as substrate temperature, gas pressure, and plasma power, may be selected to control the surface mobility of the deposition precursor and achieve optimal non-conformality. Reducing the surface mobility of the depositing material reduces the deposition rate near the bottom 203 of the recessed feature 204 relative to the field area 211 and an upper portion of the sidewall 201 can be achieved by design of the deposition material or deposition conditions. Deposition materials having higher sticking coefficients to the underlying material by precursor design or by reactant gas chemistry. Deposition conditions that reduce the residence time of the deposition materials through faster gas flows across the substrate 200 or lower partial pressures of deposition materials can reduce the deposition rate near the bottom 203 of the recessed feature 204 relative to the field area 211 and an upper portion of the sidewall 201. Increasing the reactivity of the deposition chemistries that enhances the sticking coefficient can be achieved by process manipulation of the chemistry with methods such as plasma activation or addition of catalytic materials.

Figure 2C:
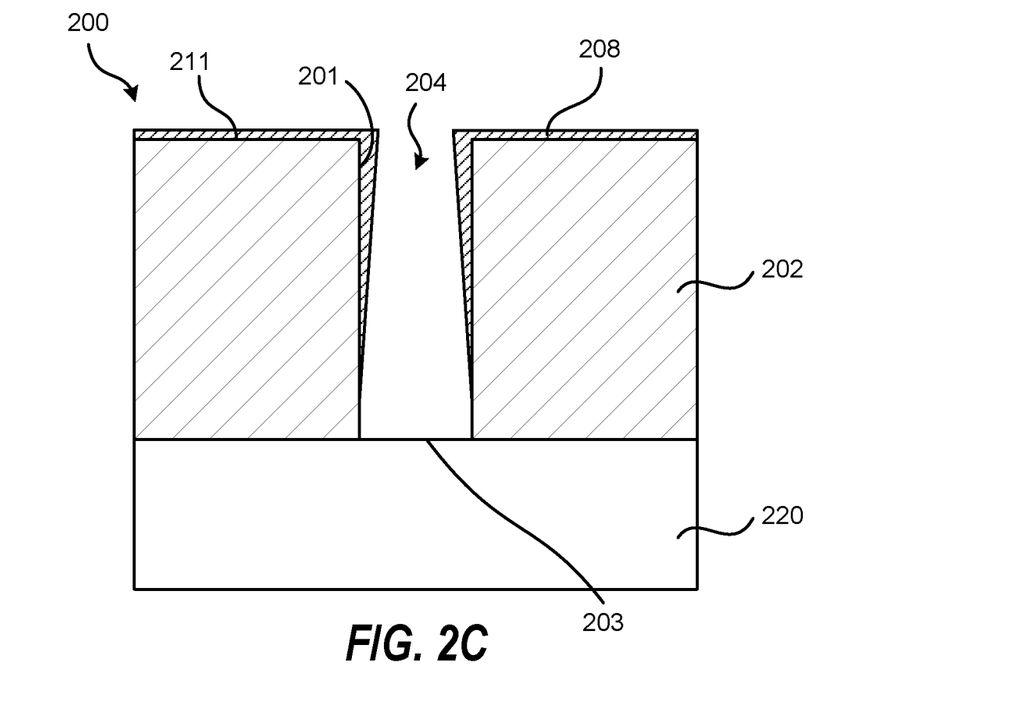

The process flow 1 further includes, in 104, removing the mask layer 208 from the bottom 203 of the recessed feature 204 in an etching process, while maintaining at least a portion of the overhang at the opening 206. As schematically shown in FIG. 2C, the uniform etching process thins the mask layer 208 on the field area 211 and on the sidewall 201, and completely removes the mask layer 208 from the bottom 203 where the mask layer 208 is the thinnest. The etching process may also completely remove the mask layer 208 from the sidewall 201 near the bottom 203. The mask layer 208 may have lower density near the bottom 203 compared to on the field area 211 and at the overhang 210, thereby allowing for faster etching of the mask layer 208 from the bottom 203 than from the field area 211 and from the overhang 210. According to some embodiments, the mask layer 208 may be etched by plasma etching. The etch gases and the etch conditions may be selected in view of providing efficient removal of the mask layer 208 from the bottom 203.

Figure 2D:
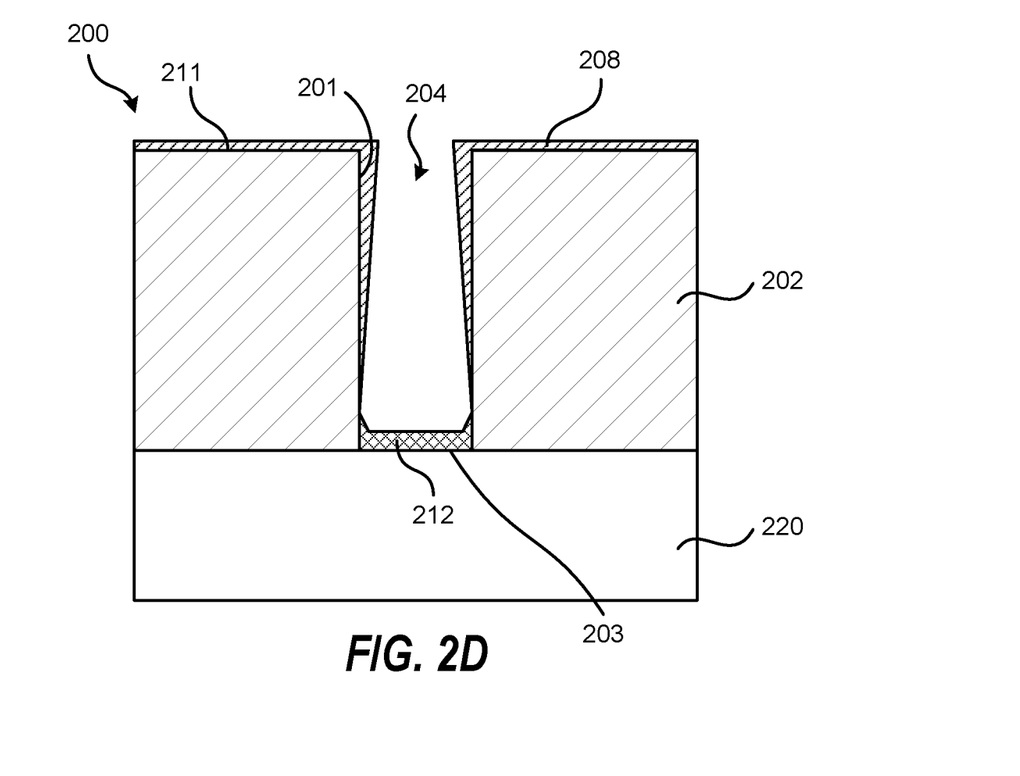

The process flow 1 further includes, in 106, selectively depositing a film 212 on the bottom 203 of the recessed feature 204. This is schematically shown in FIG. 2D. The selective deposition may be facilitated by different deposition rates and different incubation times on the material at the bottom 203 relative to the material of the mask layer 208. For example, the material of the film 212 may be selected from the group consisting of silicon, germanium, silicon germanium, a dielectric material, a metal, and a metal-containing material. The dielectric material may selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. According to another embodiment, the film 212 may be selected from the group consisting of a metal oxide film, a metal nitride film, a metal oxynitride film, a metal silicate film, and a combination thereof. For example, the metal and the metal-containing materials may be selected from the group consisting of Cu, Al, Ta, Ru, TaN, TaC, and TaCN.

In one example, the film 212 includes a metal oxide film that is deposited using atomic layer deposition (ALD) by a) pulsing a metal-containing precursor into a process chamber containing the substrate, b) purging the process chamber with an inert gas, c) pulsing an oxygen-containing precursor into the process chamber, d) purging the process chamber with an inert gas, and e) repeating a)-d) at least once.

In some examples, a thickness of the film 212 can be 10 nm or less, 5 nm or less, 4 nm or less, between 1 nm and 2 nm, between 2 nm and 4 nm, between 4 nm and 6 nm, between 6 nm and 8 nm, or between 2 nm and 6 nm.

Figure 2E:
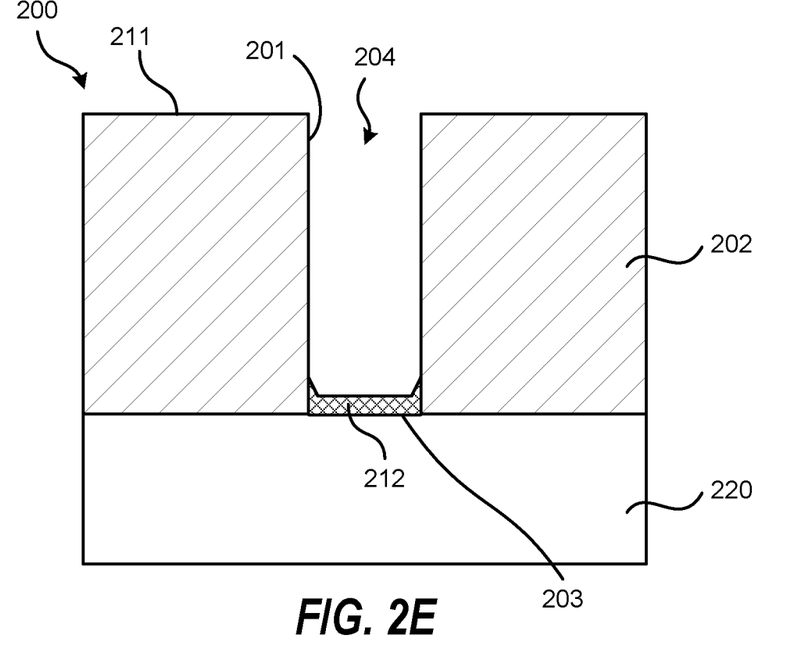

The process flow 1 further includes, in 108, removing the mask layer overhang 210. The removal of the overhang 210 may be carried out by selectively etching the mask layer 208 relative to the film 212. As schematically shown in FIG. 2E, the resulting substrate 200 contains the film 212 on the bottom 203 of the recessed feature 204.

Figure 2F:
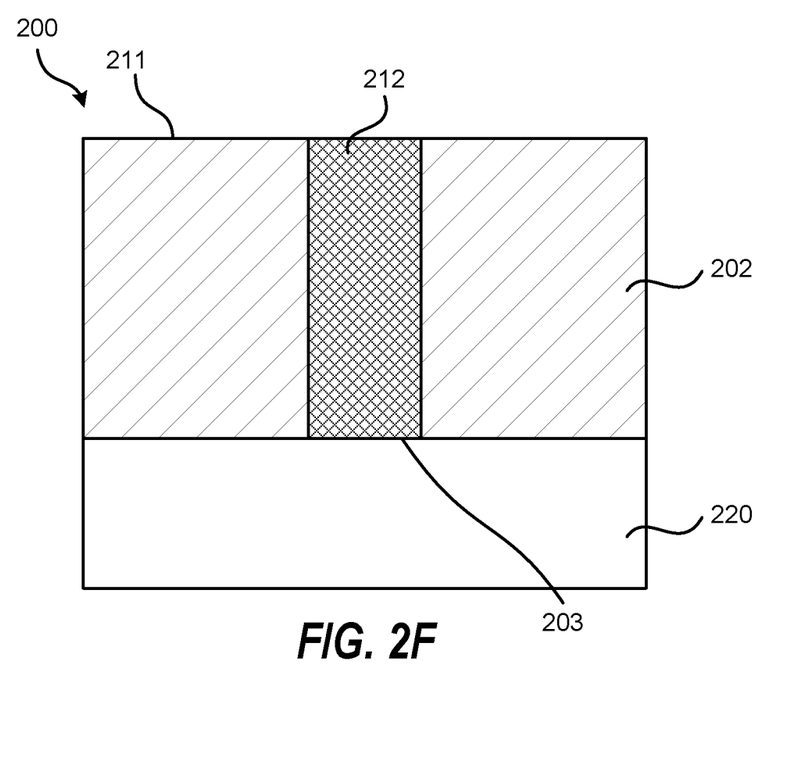

According to one embodiment of the invention, as shown by process arrow 110, steps 102-108 may be repeated until the film 212 has a desired thickness in the recessed feature 204. In one example, as depicted in FIG. 2F, the recessed feature 204 is at least substantially filled with the film 212. As the process is repeated and the recessed feature 204 is sequentially filled from the bottom up, the non-conformal mask layer 208 described in FIG. 2B can be adjusted to account for the shallower recession by either reduction in overall thickness or increasing the thickness at the top of the recessed feature 204 relative to the bottom 203.

Figure 3:
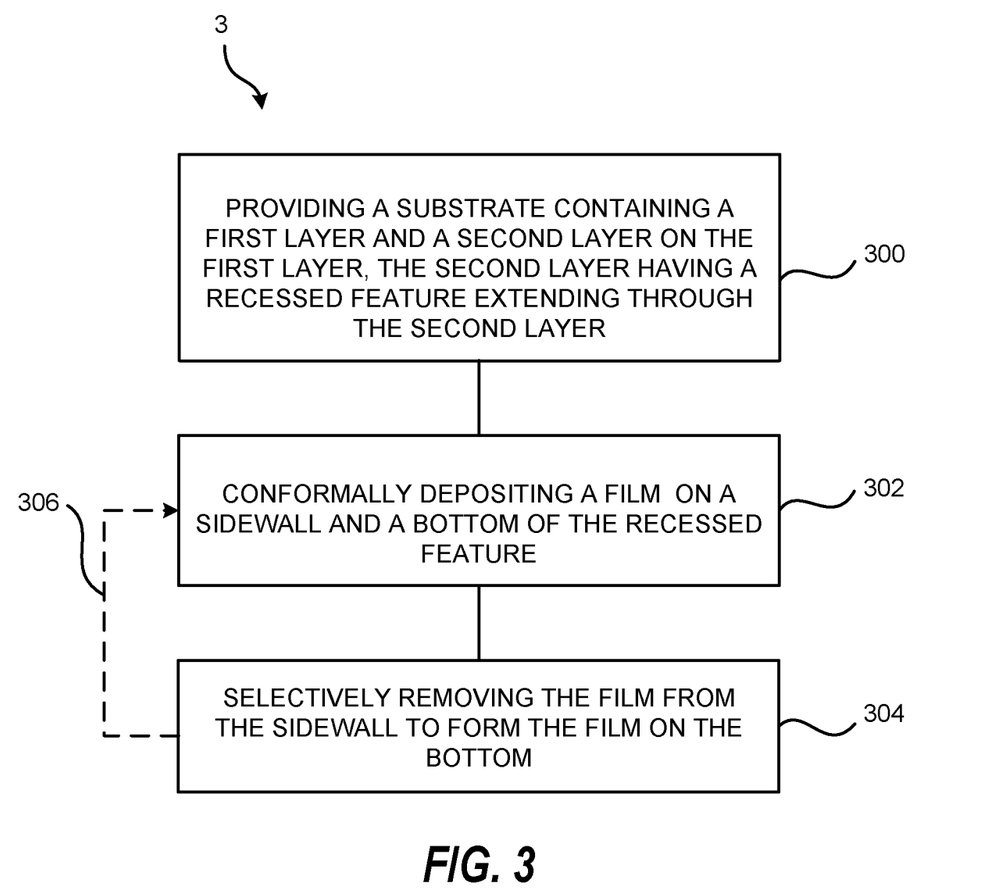
FIG. 3 is process flow diagram for processing a substrate according to an embodiment of the invention.

FIG. 3 is process flow diagram for processing a substrate according to an embodiment of the invention, and FIGS. 4A-4D schematically show through cross-sectional views a method of processing a substrate according to an embodiment of the invention.

Figure 4A:
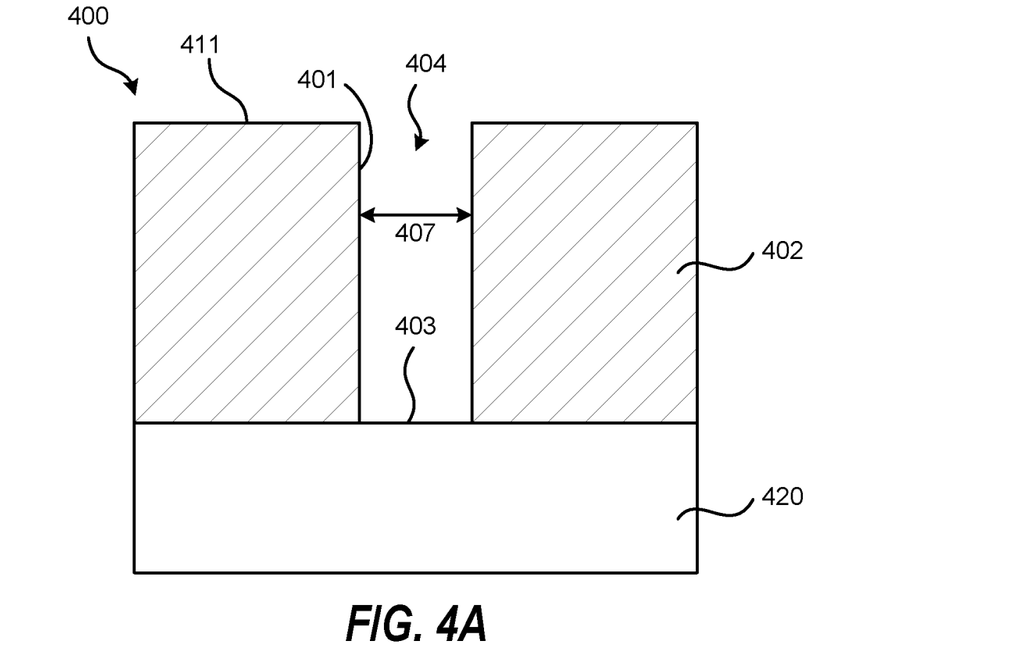
FIGS. 4A-4D schematically show through cross-sectional views a method of processing a substrate according to an embodiment of the invention.

The process flow 3 includes, in 300, providing a substrate 400 containing a first layer 420 and a second layer 402 on the first layer 420. The second layer 402 has a recessed feature 404 extending through the first layer 420. The recessed feature 404 has an opening 406, a bottom 403, and a sidewall 401. The recessed feature 404 can, for example, have a width 407 that is less than 200 nm, less than 100 nm, less than 50 nm, less than 25 nm, less than 20 nm, or less than 10 nm. In other examples, the recessed feature 404 can have a width 407 that is between 5 nm and 10 nm, between 10 nm and 20 nm, between 20 nm and 50 nm, between 50 nm and 100 nm, between 100 nm and 200 nm, between 10 nm and 50 nm, or between 10 nm and 100 nm. The width 207 can also be referred to as a critical dimension. The recessed feature 404 can, for example, have a depth of 25 nm, 50 nm, 100 nm, 200 nm, or greater than 200 nm. The recessed feature 404 may be formed using well-known lithography and etching processes.

According to one embodiment, the first layer 420 and the second layer 402 may contain the same material. Therefore, the bottom 403 and the sidewall 401 may contain the same material. According to another embodiment, the first layer 420 and the second layer 402 may contain different materials. For example, the bottom 403 and the sidewall 401 may be selected from the group consisting of silicon, germanium, silicon germanium, a dielectric material, a metal, and a metal-containing material. The dielectric material may selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. For example, the metal and the metal-containing materials may be selected from the group consisting of Cu, Al, Ta, Ru, TaN, TaC, and TaCN.

Figure 4B:
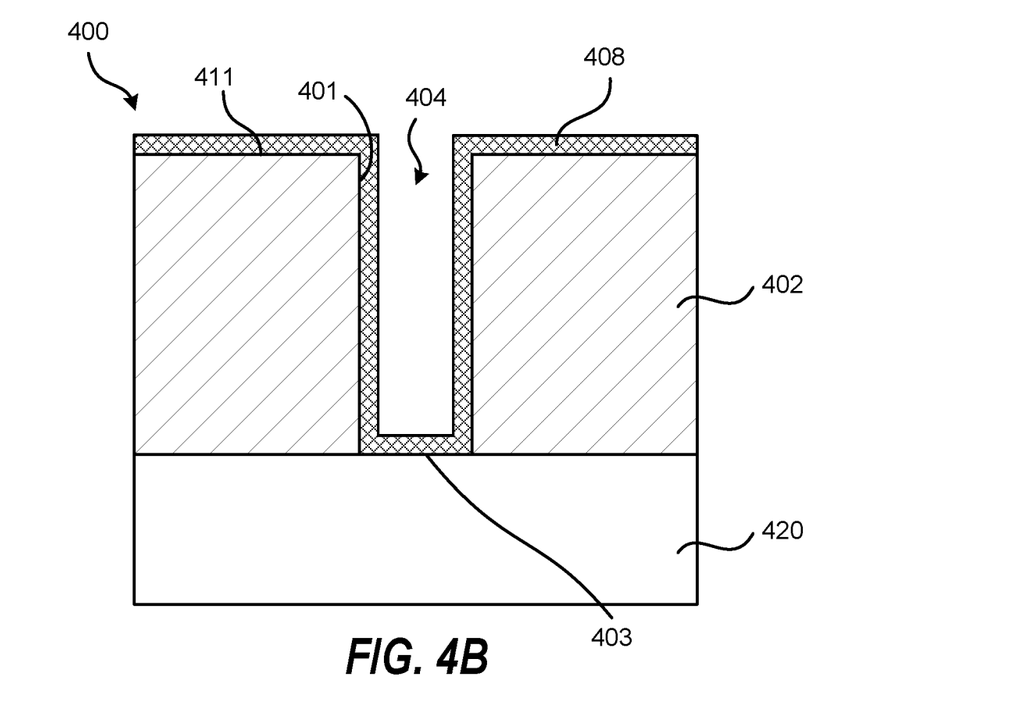

The process flow 3 further includes, in 302, conformally depositing a film 408 on the sidewall 401 and the bottom 403 of the recessed feature 404. This is schematically shown in FIG. 4B. The conformal film 408 may, for example, be deposited by chemical vapor deposition (CVD) or atomic layer deposition (ALD), and may have at least a substantially uniform thickness on the bottom 403, the sidewall 401, and the field area 411.

For example, the material of the film 408 may be selected from the group consisting of silicon, germanium, silicon germanium, a dielectric material, a metal, and a metal-containing material. The dielectric material may selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. According to another embodiment, the film 412 may be selected from the group consisting of a metal oxide film, a metal nitride film, a metal oxynitride film, a metal silicate film, and a combination thereof. For example, the metal and the metal-containing materials may be selected from the group consisting of Cu, Al, Ta, Ru, TaN, TaC, and TaCN.

In one example, the film 408 includes a metal oxide film that is deposited using atomic layer deposition (ALD) by a) pulsing a metal-containing precursor into a process chamber containing the substrate, b) purging the process chamber with an inert gas, c) pulsing an oxygen-containing precursor into the process chamber, d) purging the process chamber with an inert gas, and e) repeating a)-d) at least once. ALD process conditions and chemical materials are designed for the deposition material to saturate the deposition surface one layer only, typically limited by the complete attachment of all available sites on the surface, followed by subsequent exposure of a chemical reactant to remove the attachment-blocking sites and refresh the surface for the next self-limited layer of deposition material exposure. The mechanism is designed for conformal deposition of all exposed surfaces if exposure time is at least long enough to ensure full surface saturation of deposition and reactant materials.

In some examples, a thickness of the film 408 can be 10 nm or less, 5 nm or less, 4 nm or less, between 1 nm and 2 nm, between 2 nm and 4 nm, between 4 nm and 6 nm, between 6 nm and 8 nm, or between 2 nm and 6 nm.

Figure 4C:
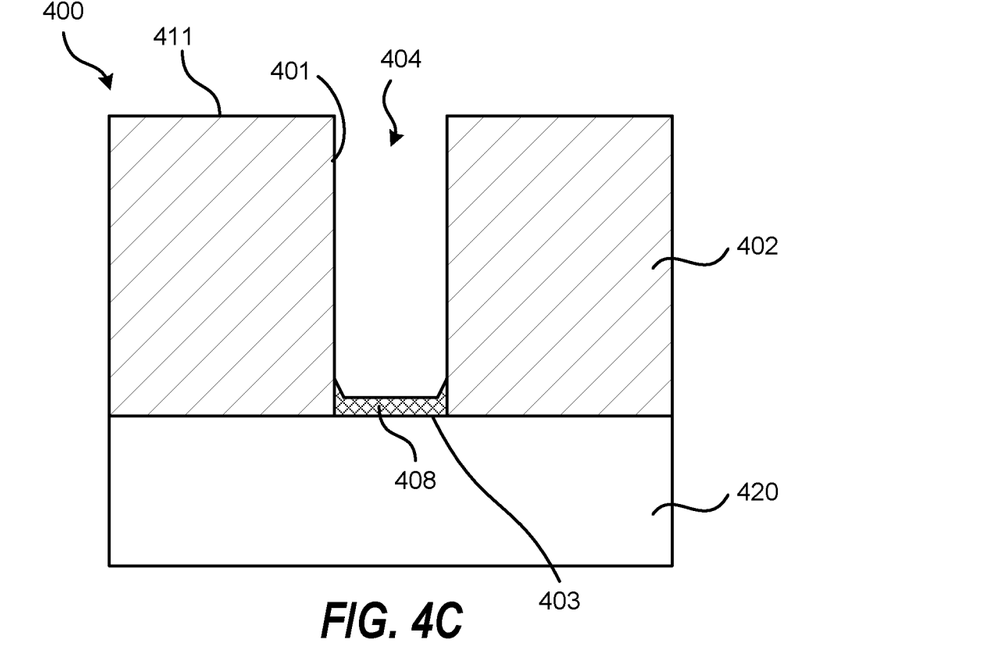

The process flow 3 further includes, in 304, selectively removing the film 408 from the sidewall 401 and from the field area 411 to form the film 408 on the bottom 403. This is schematically shown in FIG. 4C. According to some embodiments, the film 408 may be removed by etching, for example by plasma etching. The etch gases and the etch conditions may be selected in view of providing efficient removal of the film 408 from the sidewall 401 and from the field area 411. In some examples, the etch conditions can be tailored to provide less etch species to the film 408 on bottom 403 compared to the film 408 on the field area 411 and on the sidewall 401.

Figure 4D:
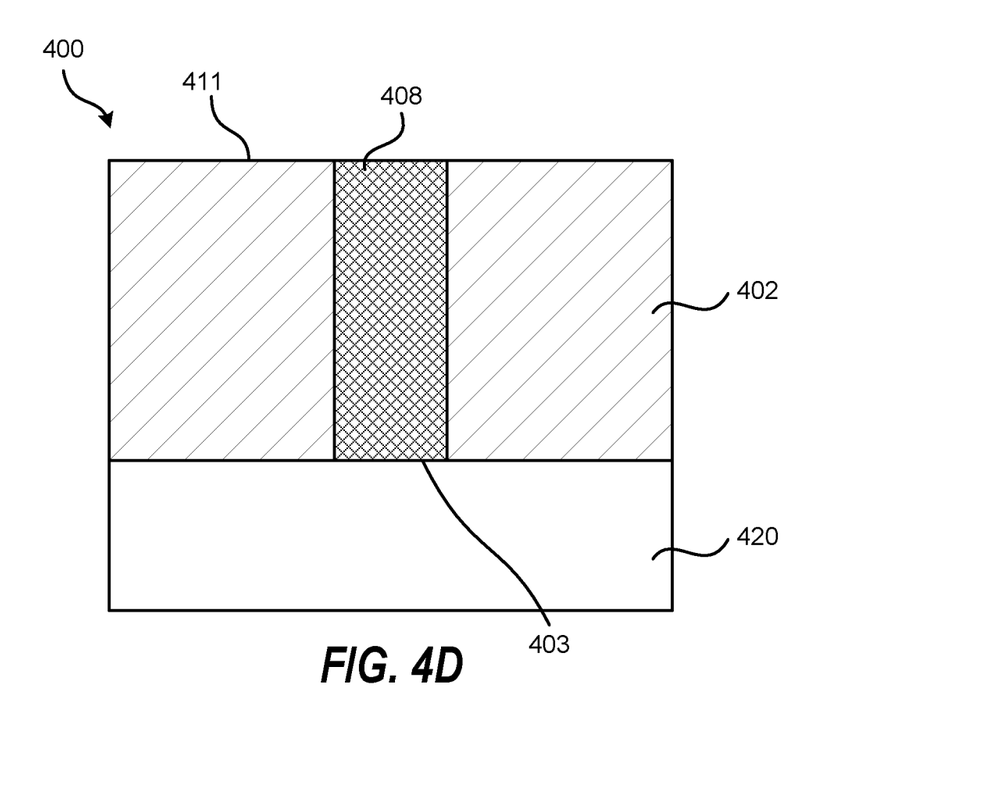

According to some embodiments of the invention, as shown by process arrow 306, steps 302 and 304 may be repeated at least once until the film 408 has a desired thickness in the recessed feature 404. In one example, as depicted in FIG. 4D, the recessed feature 404 may be at least substantially filled with the film 408.

Figure 5:
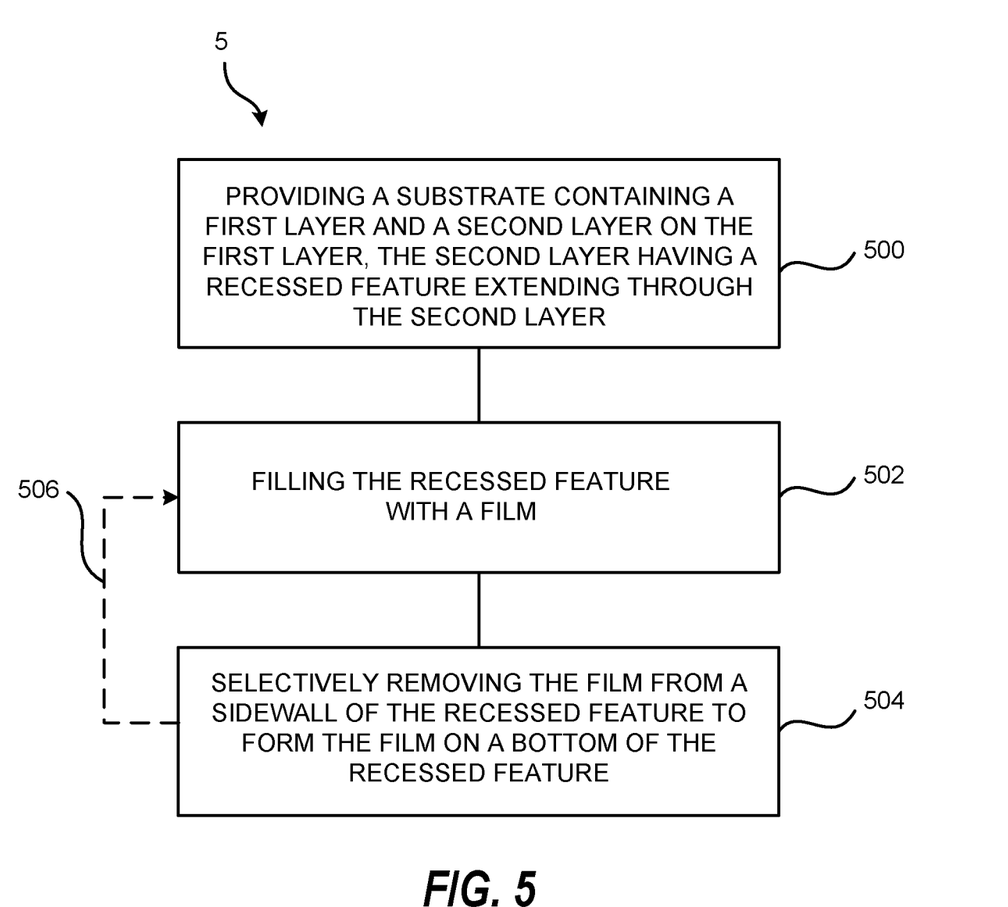
FIG. 5 is process flow diagram for processing a substrate according to an embodiment of the invention.

FIG. 5 is process flow diagram for processing a substrate according to an embodiment of the invention, and FIGS. 6A-6D schematically show through cross-sectional views a method of processing a substrate according to an embodiment of the invention.

Figure 6A:
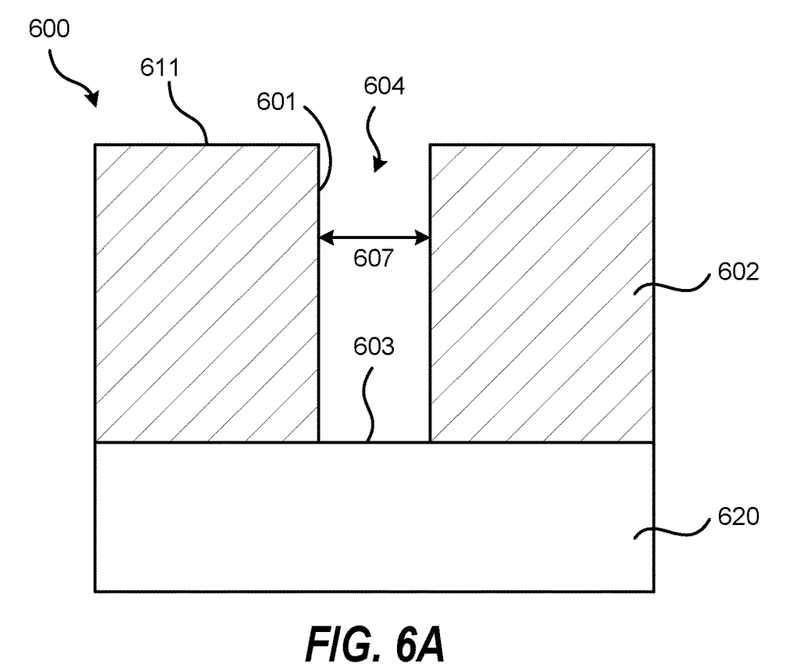
FIGS. 6A-6D schematically show through cross-sectional views a method of processing a substrate according to an embodiment of the invention.

The process flow 5 includes, in 500, providing a substrate 600 containing a first layer 620 and a second layer 602 on the first layer 620. The second layer 602 has a recessed feature 604 extending through the first layer 620. The recessed feature 604 has an opening 606, a bottom 603, and a sidewall 601. The recessed feature 604 can, for example, have a width 607 that is less than 200 nm, less than 100 nm, less than 50 nm, less than 25 nm, less than 20 nm, or less than 10 nm. In other examples, the recessed feature 604 can have a width 607 that is between 5 nm and 10 nm, between 10 nm and 20 nm, between 20 nm and 50 nm, between 50 nm and 100 nm, between 100 nm and 200 nm, between 10 nm and 50 nm, or between 10 nm and 100 nm. The width 607 can also be referred to as a critical dimension. The recessed feature 604 can, for example, have a depth of 25 nm, 50 nm, 100 nm, 200 nm, or greater than 200 nm. The recessed feature 604 may be formed using well-known lithography and etching processes.

According to one embodiment, the first layer 620 and the second layer 602 may contain the same material. Therefore, the bottom 603 and the sidewall 601 may contain the same material. According to another embodiment, the first layer 620 and the second layer 602 may contain different materials. For example, the bottom 603 and the sidewall 601 may be selected from the group consisting of silicon, germanium, silicon germanium, a dielectric material, a metal, and a metal-containing material. The dielectric material may selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. For example, the metal and the metal-containing materials may be selected from the group consisting of Cu, Al, Ta, Ru, TaN, TaC, and TaCN.

Figure 6B:
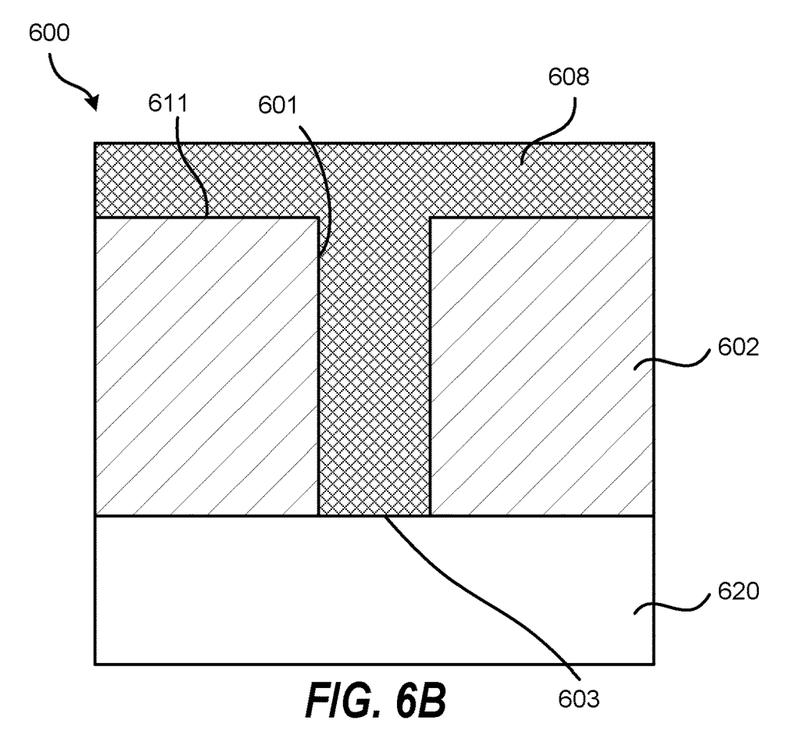

The process flow 5 further includes, in 502, filling the recessed feature 604 with a film 608. This is schematically shown in FIG. 6B. The filling further deposits the film 608 on the field area 611. For example, the material of the film 608 may be selected from the group consisting of silicon, germanium, silicon germanium, a dielectric material, a metal, and a metal-containing material. The dielectric material may selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. According to another embodiment, the film 408 may be selected from the group consisting of a metal oxide film, a metal nitride film, a metal oxynitride film, a metal silicate film, and a combination thereof. For example, the metal and the metal-containing materials may be selected from the group consisting of Cu, Al, Ta, Ru, TaN, TaC, and TaCN. In some examples, the film 608 may be deposited by PVD, sputtering, or CVD. Deposition conditions such as substrate temperature, gas pressure, and plasma power, may be selected to control the surface mobility of the deposition precursor and achieve optimal non-conformality.

In one example, the film 608 includes a metal oxide film that is deposited using atomic layer deposition (ALD) by a) pulsing a metal-containing precursor into a process chamber containing the substrate, b) purging the process chamber with an inert gas, c) pulsing an oxygen-containing precursor into the process chamber, d) purging the process chamber with an inert gas, and e) repeating a)-d) at least once.

Typically, using the ALD process to fill a recess will result in an undesirable seam at the vertical middle of the filled recess, where ALD layers depositing on opposite sides of the recess walls meet. The seam is a region of lesser film density since the convergence of ALD growing surfaces prevents the last exposure of reactant material from removing the ligands limiting further growth. Even though the ALD almost fills the recess, the seam prevents the ALD process from providing an acceptable fill by itself, in most cases.

Figure 6C:
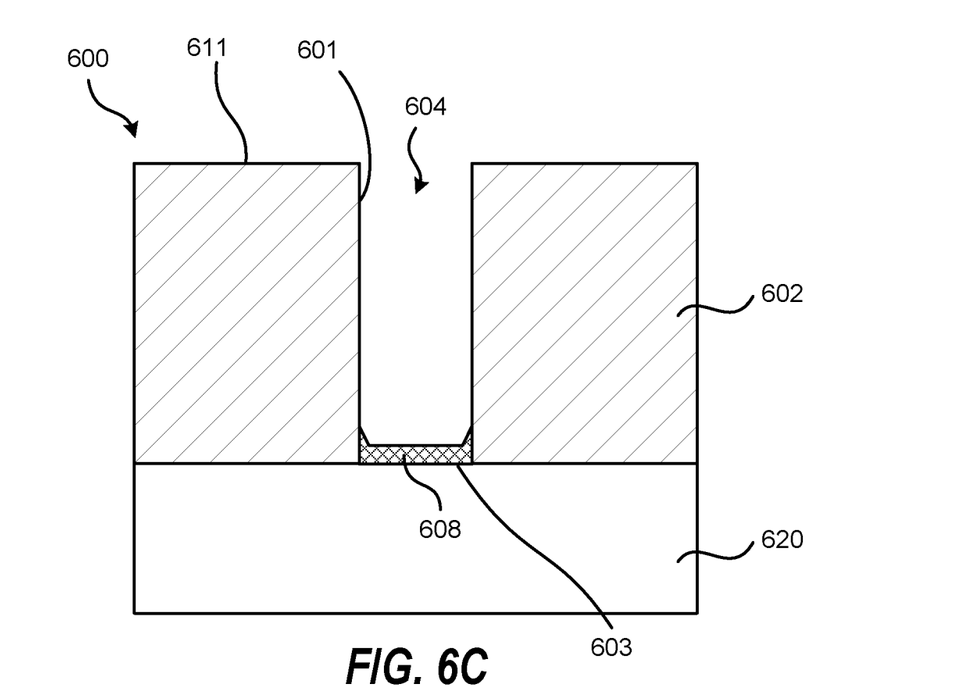

The process flow 5 further includes, in 504, selectively removing the film 608 from a sidewall of the recessed feature 604 and from the field area 611 to form the film 608 on the bottom 603 of the recessed feature 604. This is schematically shown in FIG. 6C. The film 608 may be etched using an isotropic dry etch process.

Figure 6D:
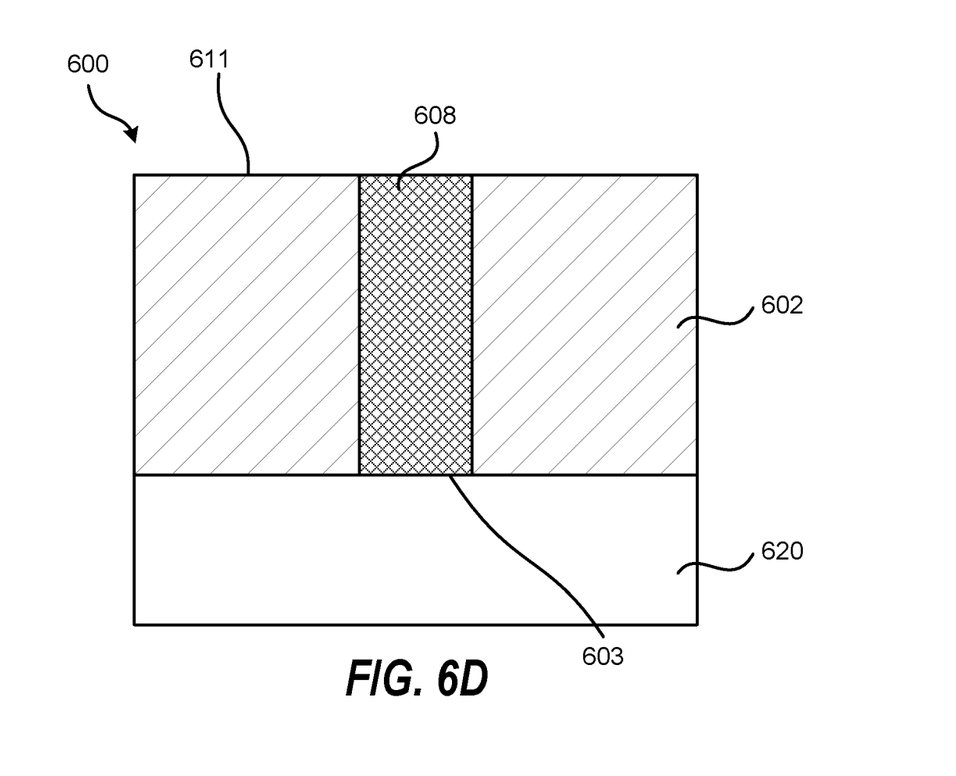

According some embodiments of the invention, as shown by process arrow 506, steps 502 and 504 may be repeated at least once until the film 608 has a desired thickness in the recessed feature 604. In one example, as depicted in FIG. 6D, the recessed feature 604 may be filled with the film 608.

A plurality of embodiments for bottom-up formation of a film in a recessed feature have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. It is therefore intended that the scope of the invention be limited not by this detailed description, but rather by the claims appended hereto.

What is claimed is:

1. A substrate processing method, comprising:
   a) providing a substrate containing a first layer and a second layer on the first layer, the second layer having a recessed feature extending through the second layer;
   b) depositing a non-conformal mask layer on the substrate, wherein the mask layer has an overhang at an opening of the recessed feature;
   c) removing the mask layer from a bottom of the recessed feature, while maintaining at least a portion of the overhang at the opening;
   d) selectively depositing a film on the bottom of the recessed feature that is not covered by the mask layer;
   e) subsequent to step d), removing the remainder of the mask layer from the recessed feature; and
   repeating steps b)-e) until the recessed feature is at least substantially filled with the film.

2. The method of claim 1, wherein the first and second layers contain the same material.

3. The method of claim 1, wherein the first and second layers contain different materials.

4. The method of claim 1, wherein the non-conformal mask layer is deposited by physical vapor deposition (PVD) or sputtering.

5. The method of claim 1, wherein the film is deposited using atomic layer deposition (ALD).

6. The method of claim 1, wherein the film includes a metal oxide film that is deposited using atomic layer deposition (ALD) by 1) pulsing a metal-containing precursor into a process chamber containing the substrate, 2) purging the process chamber with an inert gas, 3) pulsing an oxygen-containing precursor into the process chamber, 4) purging the process chamber with an inert gas, and 5) repeating 1)-4) at least once.

7. The method of claim 1, wherein the film is selected from the group consisting of a metal oxide film, a metal nitride film, a metal oxynitride film, a metal silicate film, and a combination thereof.

8. A substrate processing method, comprising:
   a) providing a substrate containing a first layer and a second layer on the first layer, the second layer having a recessed feature extending through the first layer;
   b) conformally depositing a film on a sidewall and a bottom of the recessed feature; and
   c) selectively removing the film from the sidewall by exposing the entire film to plasma etching, wherein the film is exposed to less plasma etching species on the bottom than on the sidewall to form the film on the bottom.

9. The method of claim 8, further comprising repeating steps b) and c) at least once until the film has a desired thickness in the recessed feature.

10. The method of claim 8, further comprising repeating steps b) and c) until the recessed feature is at least substantially filled with the film.

11. The method of claim 8, wherein the first and second layers contain the same material.

12. The method of claim 8, wherein the first and second layers contain different materials.

13. The method of claim 8, wherein the film is deposited by chemical vapor deposition (CVD) or atomic layer deposition (ALD).

14. The method of claim 8, wherein the film has at least substantially the same thickness on the sidewall as on the bottom.

15. The method of claim 8, wherein the film is selected from the group consisting of a metal oxide film, a metal nitride film, a metal oxynitride film, a metal silicate film, and a combination thereof.

16. A substrate processing method, comprising:
   a) providing a substrate containing a first layer and a second layer on the first layer, the second layer having a recessed feature extending through the first layer;
   b) fully filling the recessed feature with a film;
   c) removing the film from a sidewall to form the film on a bottom of the recessed feature; and
   d) repeating steps b) and c) at least once until the film has a desired thickness in the recessed feature.

17. The method of claim 16, wherein steps b) and c) are repeated until the recessed feature is at least substantially filled with the film.

18. The method of claim 16, wherein the first and second layers contain the same material.

19. The method of claim 16, wherein the first and second layers contain different materials.

20. The method of claim 16, wherein the film is deposited by physical vapor deposition (PVD), sputtering, or chemical vapor deposition (CVD).

* * * * *